US012704568B2

(12) United States Patent
Touchet-Valle et al.

(10) Patent No.: US 12,704,568 B2
(45) Date of Patent: Aug. 11, 2026

(54) LOW-LOSS SWITCHING FOR CIRCUITS, LOW-LOSS SWITCHING FOR NUCLEAR MAGNETIC RESONANCE RADIO FREQUENCY COILS, METHODS OF USE, METHODS OF MAKING, SYSTEMS, AND DEVICES

(71) Applicant: The Texas A&M University System, College Station, TX (US)

(72) Inventors: Edith Touchet-Valle, College Station, TX (US); Seelay Tasmim, Allston, MA (US); Mary P. McDougall, College Station, TX (US); Taylor Ware, College Station, TX (US)

(73) Assignee: The Texas A&M University System, College Station, TX (US)

( * ) Notice: Subject to any disclaimer, the term of this patent is extended or adjusted under 35 U.S.C. 154(b) by 155 days.

(21) Appl. No.: 18/651,795

(22) Filed: May 1, 2024

(65) Prior Publication Data

US 2024/0369657 A1 Nov. 7, 2024

Related U.S. Application Data

(60) Provisional application No. 63/499,516, filed on May 2, 2023.

(51) Int. Cl.
*G01R 33/36* (2006.01)
*H01H 36/00* (2006.01)

(52) U.S. Cl.
CPC ......... *G01R 33/3607* (2013.01); *H01H 36/00* (2013.01)

(58) Field of Classification Search
CPC ............................ G01R 33/3607; H01H 36/00
See application file for complete search history.

(56) References Cited

U.S. PATENT DOCUMENTS

| | | | | |
|---|---|---|---|---|
| 6,025,725 | A * | 2/2000 | Gershenfeld | H01F 17/0006 324/653 |
| 7,582,349 | B1 * | 9/2009 | Herrera | F03G 7/0612 428/116 |
| 2006/0192465 | A1 * | 8/2006 | Kornbluh | B64C 3/48 310/309 |
| 2009/0104433 | A1 * | 4/2009 | Li | H01B 1/16 428/323 |
| 2012/0081115 | A1 * | 4/2012 | Reykowski | G01R 33/3664 324/309 |
| 2013/0245402 | A1 * | 9/2013 | Ziaie | G01N 27/72 600/309 |
| 2017/0265603 | A1 * | 9/2017 | Ronsen | A44B 18/0007 |
| 2020/0321808 | A1 * | 10/2020 | Hendriks | A61F 2/246 |
| 2021/0205103 | A1 * | 7/2021 | Xiao | B25J 9/1075 |
| 2024/0192296 | A1 * | 6/2024 | Motovilova | G01R 33/3628 |

* cited by examiner

*Primary Examiner* — Eman A Alkafawi
*Assistant Examiner* — Suresh K Rajaputra
(74) *Attorney, Agent, or Firm* — THOMAS | HORSTEMEYER, LLP

(57) ABSTRACT

The present provides for a stimuli-responsive switches, circuits including a stimuli-responsive switch, systems include the circuit, method of switching frequencies in a nuclear magnetic resonance system, and the like. The stimuli-responsive switch can be made of a stimuli-responsive material, where a conductive material can be moved and brought in contact with disconnected conductive paths by the stimuli-responsive material so that upon stimulation a conductive path can be achieved.

20 Claims, 7 Drawing Sheets

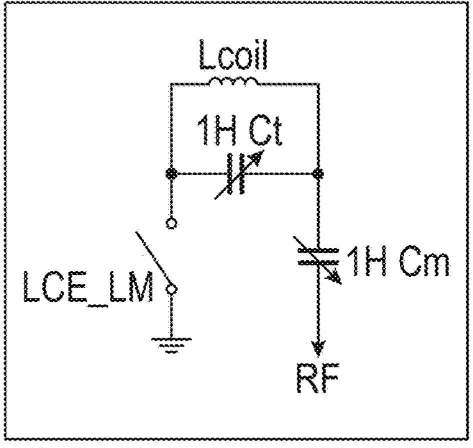
FIG. 1.1A
FIG. 1.1B
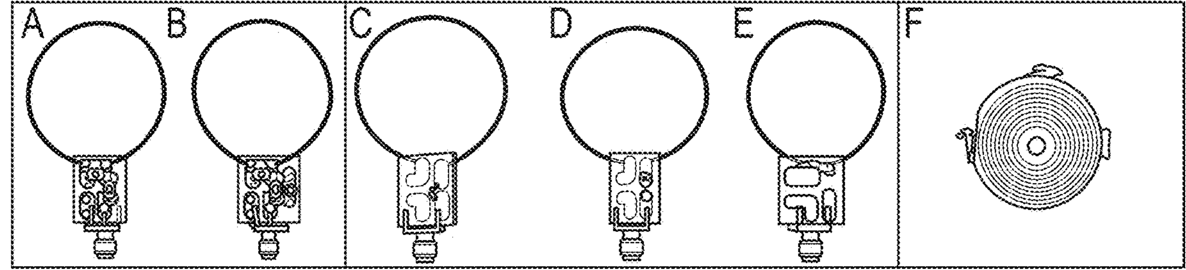
FIG. 1.2
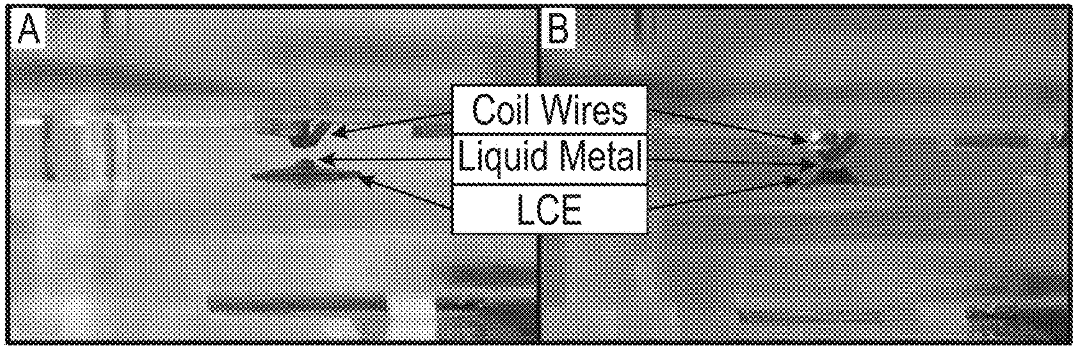
FIG. 1.3A
FIG. 1.3B

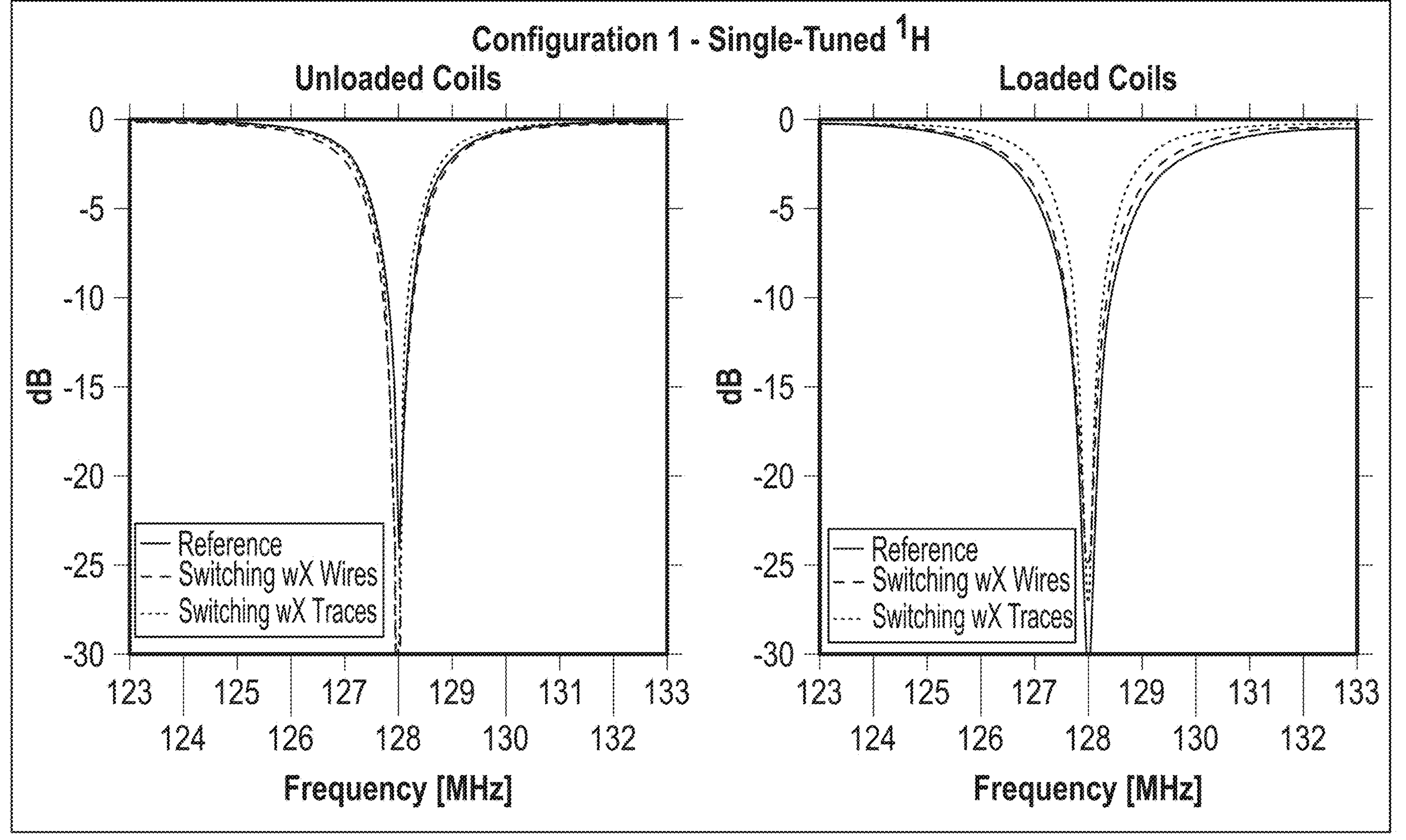
FIG. 1.4A

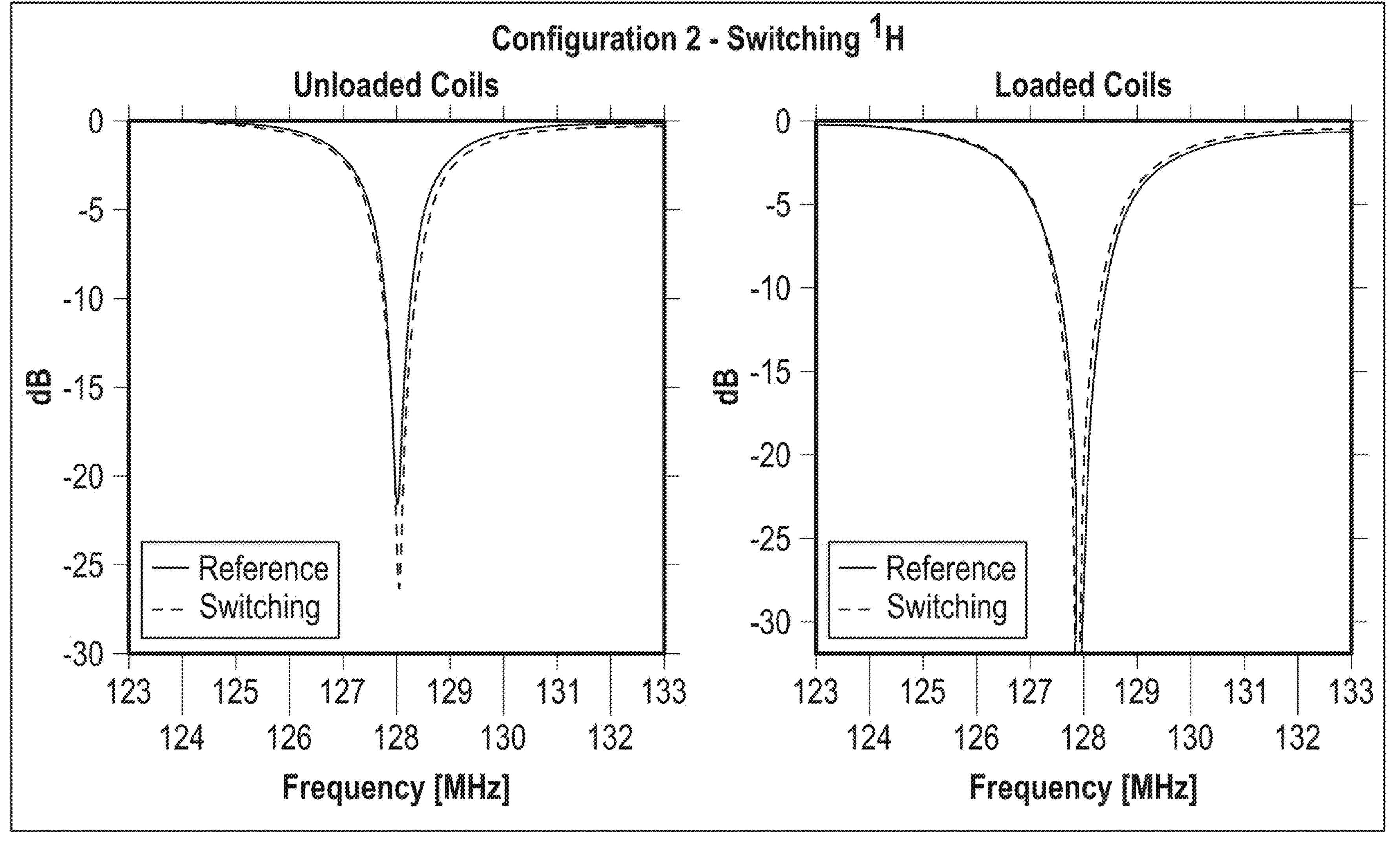
FIG. 1.4B

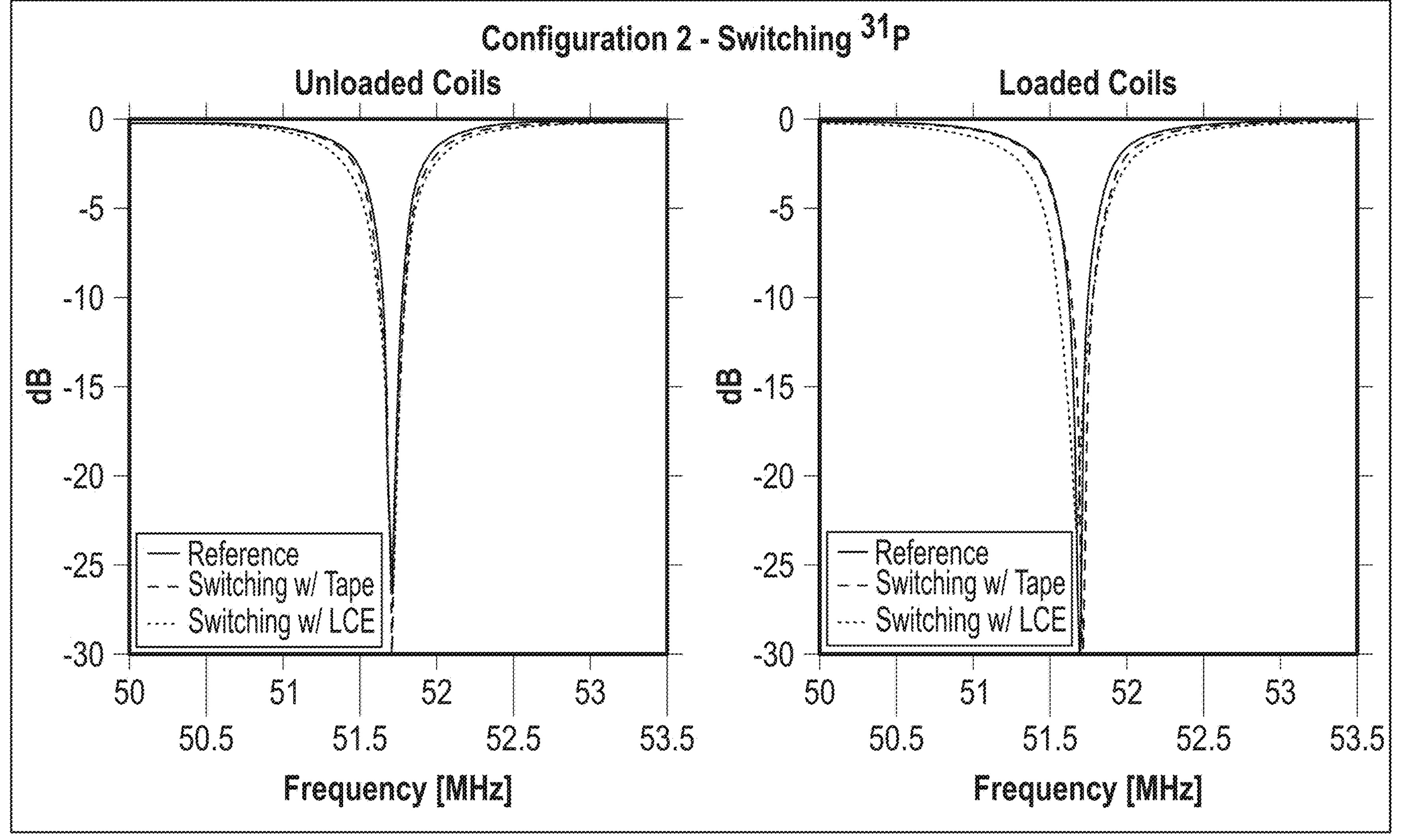
FIG. 1.4C

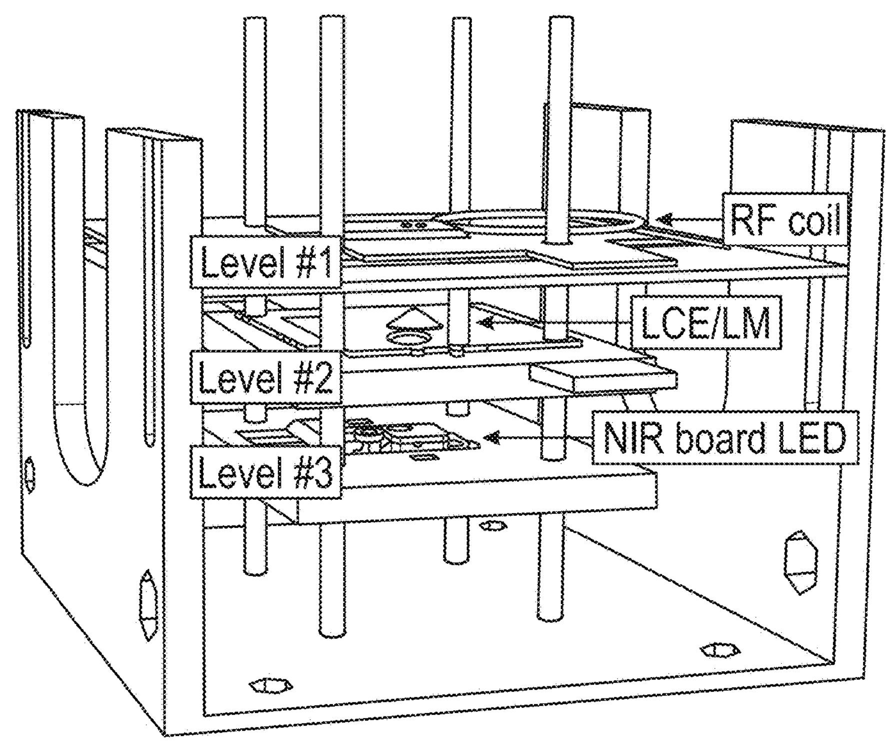
FIG. 2.1
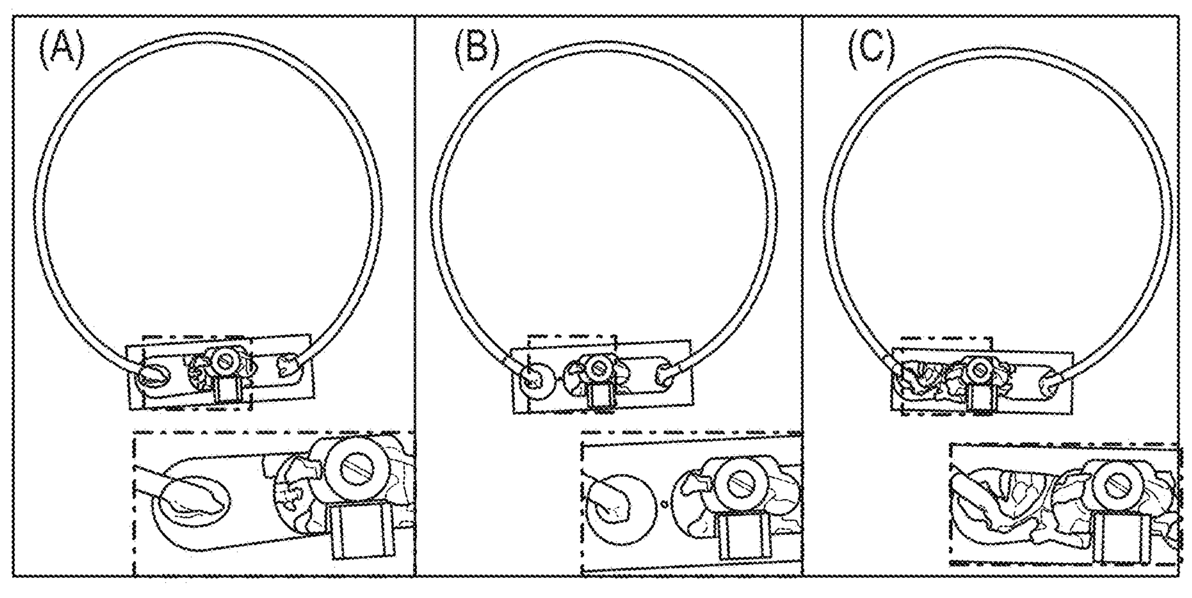
FIG. 2.2A FIG. 2.2B FIG. 2.2C

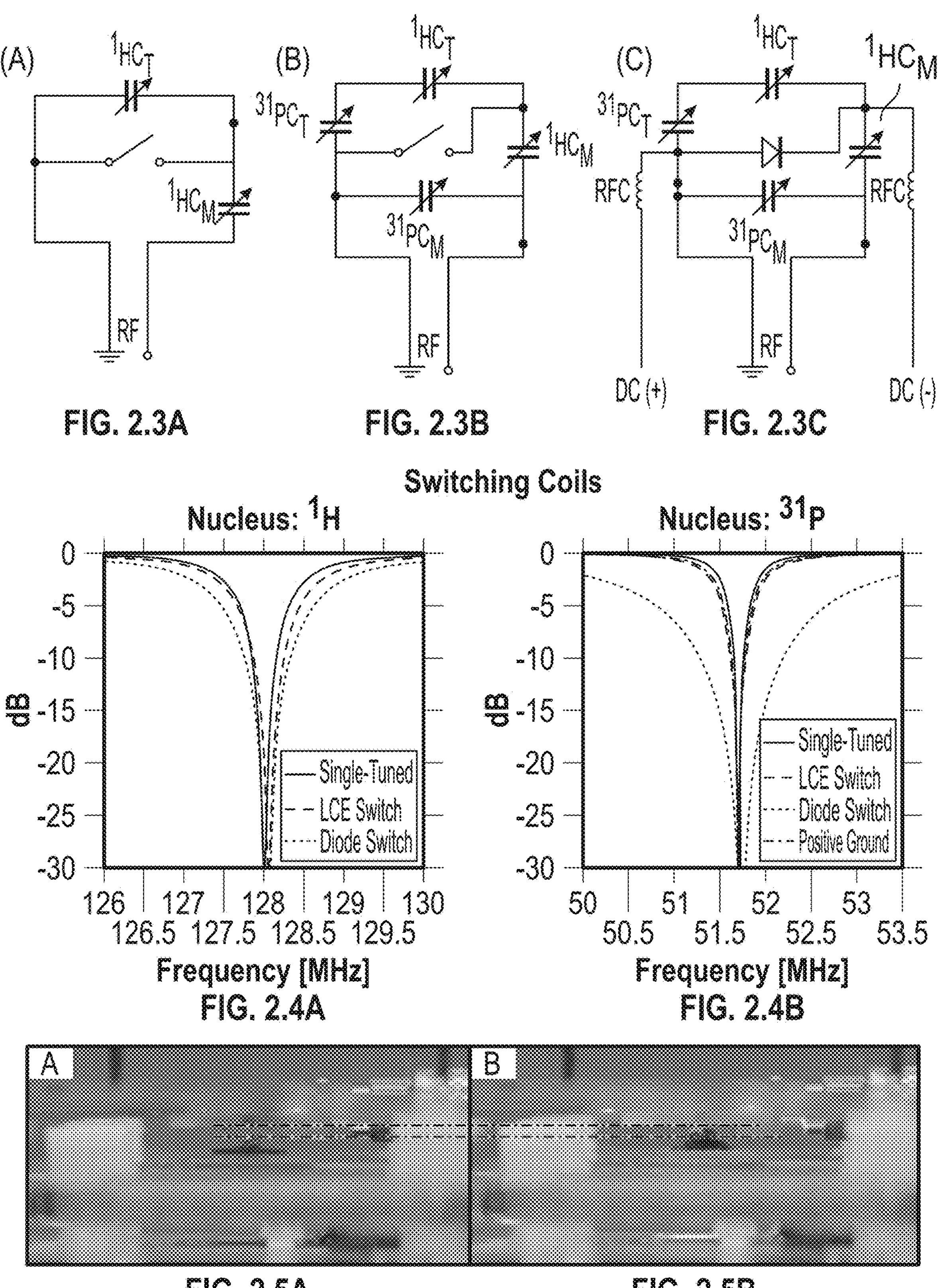
FIG. 2.3A
FIG. 2.3B
FIG. 2.3C
FIG. 2.4A
FIG. 2.4B
FIG. 2.5A
FIG. 2.5B

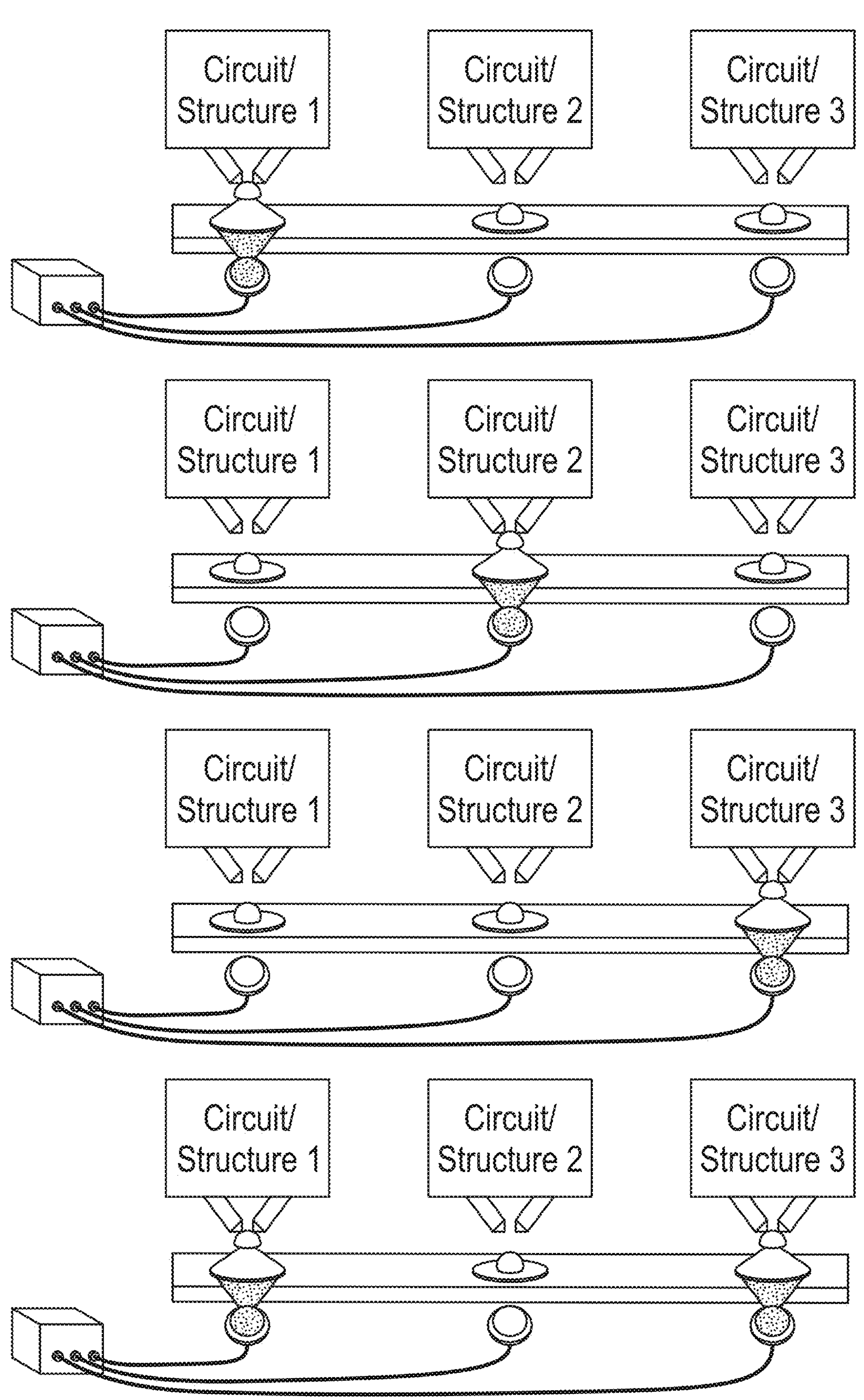
FIG. 3.1

LOW-LOSS SWITCHING FOR CIRCUITS, LOW-LOSS SWITCHING FOR NUCLEAR MAGNETIC RESONANCE RADIO FREQUENCY COILS, METHODS OF USE, METHODS OF MAKING, SYSTEMS, AND DEVICES

CROSS-REFERENCE TO RELATED APPLICATION

This application claims priority to U.S. provisional application entitled "LOW-LOSS SWITCHING FOR NUCLEAR MAGNETIC RESONANCE RADIO FREQUENCY COILS, METHODS OF USE, METHODS OF MAKING, SYSTEMS, AND DEVICES" having Ser. No. 63/499,516 filed on May 2, 2023, which is entirely incorporated herein by reference.

FEDERAL FUNDING

This invention was made with government support under Grant Nos. R01EB028533-02S1 and R21EB028547, awarded by the National Institutes of Health. The government has certain rights in the invention.

BACKGROUND

Traditional switching techniques suffer from high insertion loss as a result of inherent limitations with the components but also the number of components required for activation. This is problematic for applications that require high signal-to-noise ratios, such as nuclear magnetic resonance (NMR) applications. Therefore, developing switches that have low resistive losses, low complexity, and can be activated remotely are needed. These switches are particularly useful in NMR applications if their activation is compatible with NMR systems.

SUMMARY

The present provides for a stimuli-responsive switches, circuits including a stimuli-responsive switch, systems include the circuit, method of switching frequencies in a nuclear magnetic resonance system, and the like.

The present disclosure provides for a device comprising: a stimuli-responsive switch and two conductors of a circuit, wherein the stimuli-responsive switch includes a stimuli-responsive material, wherein the stimuli-responsive switch includes a conductive material disposed on the stimuli-responsive material of the stimuli-responsive switch, wherein the stimuli-responsive switch has the characteristic of being responsive to a stimuli, wherein the stimuli-responsive switch is in a first state and is not in contact with the two conductors, wherein the stimuli-responsive switch is in a second state and is in electrical connection with the two conductors via the conductive material.

The present disclosure provides for a method of activating a switch in a circuit comprising: providing a stimuli-responsive switch in a first state, wherein the stimuli-responsive switch is between a first pair of conductors in the circuit, wherein when the stimuli-responsive switch is in a first state, the stimuli-responsive switch is not in contact with first pair of conductors, and stimulating the stimuli-responsive switch with a stimulus, wherein the stimuli-responsive switch changes from the first state to a second state, wherein when the stimuli-responsive switch is in a second state, the stimuli-responsive switch is in electrical connection with the first pair of conductors.

The present disclosure provides for a nuclear magnetic resonance system, comprising: a circuit, wherein the circuit is configured to change an operation frequency of a radiofrequency coil of the magnetic resonance system from a first frequency to a second frequency, wherein the circuit includes a stimuli-responsive switch in a first state, wherein when the stimuli-responsive switch is in the first state, the operation frequency of the radiofrequency coil is at the first frequency, wherein the circuit is configured to switch from the first state to a second state upon stimulation of the stimuli-responsive switch by a stimulus, wherein when the stimuli-responsive switch is in the second state, the operation frequency of the radiofrequency coil is at the second frequency, wherein the circuit include the stimuli-responsive switch and two conductors, wherein the stimuli-responsive switch includes a stimuli-responsive material, wherein the stimuli-responsive switch includes a conductive material disposed on the stimuli-responsive switch, wherein when the stimuli-responsive switch is in a first state, the conductive material of the stimuli-responsive switch is not in contact with the two conductors, wherein when the stimuli-responsive switch is in the second state, the conductive material of the stimuli-responsive switch is in electrical connection with the two conductors via the conductive material.

BRIEF DESCRIPTION OF DRAWINGS

Further aspects of the present disclosure will be more readily appreciated upon review of the detailed description of its various embodiments, described below, when taken in conjunction with the accompanying drawings.

FIGS. 1.1A-B illustrate a circuit schematic of the Liquid Crystal Elastomer (LCE) Switching System, wherein FIG. 1.1(A) is a $^{1}$H coil and FIG. 1.1(B) is a $^{1}$H-$^{31}$P coil.

FIG. 1.2 illustrates in (A) Coil Configuration #1—Top view, (B) Coil Configuration #2—Top view, (C) Coil Configuration #1—Bottom view with wires, (D) Coil Configuration #1—Bottom view with traces, (E) Coil Configuration #2—Bottom View, and (F) LCE with LM droplet.

FIGS. 1.3A-B illustrate LCE Switch Actuation: (FIG. 1.3A) Off-state. (FIG. 1.3B) On-state.

FIGS. 1.4A-C illustrate $S_{11}$ plots of reference and switching coils: (FIG. 1.4A) Configuration #1—$^{1}$H. (FIG. 1.4B) Configuration #2—$^{1}$H. (FIG. 1.4C) Configuration #2—$^{31}$P.

FIG. 2.1 illustrates a schematic of the test platform for the LCE coils. Level #1 contains the RF coil. Level #2 contains the LCE and liquid metal switch. Level #3 contains the NIR chip on board LED device.

FIGS. 2.2A-C illustrate resonant loop coils: (FIG. 2.2A) Standard resonant coil (R-Ref), (FIG. 2.2B) Resonant coil with open trace path to be completed with LCE switch (R-LCE), (FIG. 2.2C) Resonant coil with open trace path connected using copper tape (positive control—R-PC).

FIGS. 2.3A-C illustrate the switching network design: (FIGS. 2.3A) Schematic for single-tuned coil with open trace to be detuned by the LCE switch, (FIGS. 2.3B) LCE coil (Coil-DT-LCE) with open trace to switch frequency with LCE-LM switch, (FIGS. 2.3C) Schematic for PIN diode coil (Coil-DT-D) with an identical network as Coil-DT-LCE but replacing open trace with standard switching circuitry.

FIGS. 2.4A-B illustrate $S_{11}$ plots of each coil and frequency.

FIGS. 2.5A-B illustrate the LCE/LM switch before and after actuation, making full contact with a board.

FIG. 3.1 illustrates a schematic showing a circuit having three stimuli-responsive switches and how one or more of the switches can be used.

DETAILED DESCRIPTION

The present provides for the use of a stimuli-responsive switch, circuits including the stimuli-responsive switch, systems include the circuit, method of switching frequencies in a nuclear magnetic resonance system, and the like.

This disclosure is not limited to particular embodiments described, and as such may, of course, vary. The terminology used herein serves the purpose of describing particular embodiments only, and is not intended to be limiting, since the scope of the present disclosure will be limited only by the appended claims.

Where a range of values is provided, each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges independently may be included in the smaller ranges and are also encompassed within the disclosure, subject to any specifically excluded limit in the stated range. Where the stated range includes one or both of the limits, ranges excluding either or both of those included limits are also included in the disclosure.

Embodiments of the present disclosure will employ, unless otherwise indicated, techniques of medicine, organic chemistry, biochemistry, molecular biology, pharmacology, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, reaction materials, manufacturing processes, dimensions, frequency ranges, applications, or the like, as such can vary. It is also to be understood that the terminology used herein is for purposes of describing particular embodiments only, and is not intended to be limiting. It is also possible in the present disclosure that steps can be executed in different sequence, where this is logically possible. It is also possible that the embodiments of the present disclosure can be applied to additional embodiments involving measurements beyond the examples described herein, which are not intended to be limiting. It is furthermore possible that the embodiments of the present disclosure can be combined or integrated with other measurement techniques beyond the examples described herein, which are not intended to be limiting.

It should be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Prior to describing the various embodiments, the following definitions are provided and should be used unless otherwise indicated.

Discussion

NMR radio frequency (RF) coils are the component within the NMR system that are responsible for the generation and receipt of the NMR signal. To acquire these signals, the RF coils must operate at a specific frequency-which is defined by the magnetic field strength and the intrinsic properties of the nucleus. Most RF coils acquire data from the hydrogen nucleus because they are the most abundant in nature, therefore, they only operate at the hydrogen frequency. However, using a non-hydrogen nucleus is of interest. Non-hydrogen nuclei enable the study of biochemical information that augment data acquired from hydrogen. However, multinuclear NMR is challenging due to the inherent low signal of the non-hydrogen nuclei and some other constraints.

Currently, there are multiple methods to create multinuclear coil designs. Some methods enable simultaneous operation at multiple frequencies and other methods only allow for switching between individual frequencies. In both techniques, additional components are used to enable the frequency switch including inductors, PIN diodes, varactor-diodes, and micro-electro-mechanical system (MEMS) switches. However, a major limitation is that these components introduce significant resistive loses to the system. These components impact the performance of the coil resulting in decreased sensitivity for at least one of the nuclei when compared to their single-tuned counterpart. The designs that switch frequency of operation instead of enabling simultaneous frequencies also require the use of RF chokes and DC lines, adding complexity to the system. Since these components introduce losses, they further impact signal-to-noise ratio (SNR). Therefore, implementing a technology that will help enhance multinuclear NMR while also minimizing the losses coming from the coil itself is important. The present disclosure provides for a circuit and a method of switching that avoids the use of these lossy components. In addition, the present disclosure is advantageous in that the circuit does not require complicated circuit designs and can be used to introduce multiple frequencies into the coil system. Additionally, switch activation is done outside of the scanner and is inherently NMR compatible.

Aspects of the present disclosure provide for the use of a stimuli-responsive (e.g., light, heat, and/or current) switch (e.g., polymer switch, alloy switch, composite switch, and the like). In an aspect, the stimuli-responsive switch can be used in a circuit for many types of electronic systems. In an aspect, the stimuli-responsive switch can be used in a nuclear magnetic resonance system to switch the operation frequency of a radio frequency coil (e.g., a nuclear magnetic resonance (NMR) radiofrequency (RF) coil) without causing any significant resistive losses, compared to standard switching technology. In an aspect, the stimuli-responsive switch can be made of a stimuli-responsive material (e.g., stimuli-responsive polymer material, stimuli-responsive alloy material, and the like), where a conductive material can be moved and brought in contact with disconnected conductive paths by the stimuli-responsive material (e.g., at the center) so that upon stimulation a conductive path can be achieved.

For example, upon stimulation, the stimuli-responsive material changes shape, bringing the conductive material in contact with a circuit (e.g., a pair of conductors or leads) for an RF coil to control its resonant frequency (or alternatively breaking contact with the circuit). The RF coil operates at a specific frequency prior to the conductive material coming in contact with the RF coil. When the conductive material comes in contact with the pair of conductors of the circuit board to control the resonant frequency of the RF coil, it closes an open connection that controls the resonant frequency. In other words, the frequency changes discretely from one frequency directly to a second frequency (e.g., the two frequencies are discrete and the switch is from one directly to the other). In another configuration, additional discrete frequency changes can be achieved. With this technology, no additional components are used for frequency switching, eliminating significant resistive losses associated with other components. In the first state, the frequency can be an operation frequency of a radiofrequency coil for a particular nucleus (e.g., hydrogen) and then the frequency in the second state can be an operation frequency for a different nucleus. In an aspect, the frequency can change between a hydrogen frequency to a non-hydrogen nucleus (e.g., 31P, 19F, 13C, 23Na) frequency or between any number of different nuclei frequencies with multiple stimuli-responsive switches.

By changing the capacitance or inductance of the coil, the frequency of operation can be changed. In present disclosure, the capacitance/inductance needed to enable operation at other frequencies is present on circuit paths that are disconnected from the coil on one end but connected on the other end. The conductive material on the stimuli-responsive material (e.g., stimuli-responsive polymer) connects the circuit path of choice to change the frequency of operation. This eliminates the need for the use of other components that have significant losses associated with them. The present disclosure provides for technology that simply completes a conductive path, and significantly reduces any losses.

Measurements comparing four different coils are discussed below; the first operated at a single frequency without the addition of any components, the second coil implemented the disclosed technology, the third coil was used as a positive control, and the fourth coil implemented standard switching technology. In coil design, it is common practice to compare a multinuclear coil to its single-frequency counterpart to see the losses introduced by the multinuclear circuit design. The quality-factor (Q) and signal-to-noise ratio (SNR) are measurements that can help evaluate the performance of coils. The Q value is proportional to SNR and gives a good estimate of performance prior to scanner measurements (i.e., SNR) for a given coil geometry. Q is a ratio of the power stored in the circuit versus the radiated power at a specific frequency.

Below are the results obtained from this experiment when we compared the four different coils at two different frequencies:

Coil Positive Control:

Frequency #1: −21% change in Q when compared to a single-tuned coil

Frequency #2: −27% change in Q when compared to a single-tuned coil Coil Disclosed Technology:

Frequency #1: −21% change in Q when compared to a single-tuned coil

Frequency #2: −38% change in Q when compared to a single-tuned coil Coil with Standard Switching Technology:

Frequency #1: −46% change in Q when compared to a single-tuned coil

Frequency #2: −88% change in Q when compared to a single-tuned coil

Coil manufacturers that make multinuclear coils would benefit from aspects of the present disclosure that will not impact the performance of the coil for any of the frequencies at which the coil operates in the way standard multinuclear methods do. These coils may be used in any non-time sensitive switching applications, such as animal and pre-clinical research, chemistry, food-safety research, and down-hole experiments.

In addition to enabling frequency switching in a single RF coil, the stimuli-responsive switch may also be used to activate (or deactivate) separate coils. These individual coils may be tuned to the same frequency or different frequencies, and they may be activated by one or multiple stimuli-responsive switches. The switches may activate one structure at a time, or it may activate multiple structures simultaneously (see FIG. 3.1).

The present disclosure provides for a circuit that includes a stimuli-responsive switch. The circuit includes two leads or conductors (also referred to as a "pair of leads" or "pair of conductors" and the stimuli-responsive switch disposed adjacent the two conductors (e.g., copper wire or other conductive material). In a first configuration (e.g., a first state), the two conductors are not electrically connected, and the stimuli-responsive switch is not in contact with the two conductors. In a second configuration (e.g., a second state), the two conductors are in electrical connection and the stimuli-responsive switch is in contact with the two conductors. The two conductors are in electrical connection upon the stimuli-responsive switch switching from a first state to a second state. In the first state the stimuli-responsive switch is not in contact with the two conductors, while in the second state the stimuli-responsive switch is in contact with the two conductors forming the circuit. Switching from the stimuli-responsive switch from the first state to the second state allows the circuit to change the frequency of the coil or to activate a radio frequency coil. In an aspect, the switch from the first state to the second state results in an activation or a de-activation, of a conductive structure within a magnetic resonance system.

The stimuli-responsive switch can change shape (e.g., from the first state to the second state or vice versa) upon exposure to light, heat, current, or the like. The shape can include changing one or more dimensions of the stimuli-responsive switch. The change in dimension can result in the stimuli-responsive switch contacting the two leads or disconnecting contact from the two leads. The change in dimension(s) can include increasing or decreasing in thickness or length or both, flexing in direction, bowing up or down, bending, twisting, a combination of two or more of these, or the like, of the stimuli-responsive switch. In an example, the stimuli-responsive switch can be in a first state where the stimuli-responsive switch is flat and upon exposure to a stimulus, the stimuli-responsive switch flexes so that part of the stimuli-responsive switch is no longer flat and curves up (or down) to contact the two leads. The reverse configuration can also be used where the stimuli-responsive switch is in contact with the two leads and upon exposure to a stimuli the stimuli-responsive switch flexes away from contacting the two leads. Other configurations are also possible depending upon the desired outcome.

The stimuli-responsive switch can be made of a material upon which a conductive material is disposed so that upon contact with the two conductors and electrical connection can be established. The conductive material can include a conductive liquid metal or other conductive material. The position of the conductive material on the stimuli-responsive switch is such that an electrical connection is established with the two conductors upon contact with the two conductors.

In an aspect, the stimuli-responsive switch can be made of a material such as liquid crystal elastomers (LCEs), azobenzene-based LCE material, shape memory alloys, shape memory polymers, dielectric electroactive polymers, piezoelectric materials, and the like.

In an aspect, the LCEs can be responsive to stimuli such as temperature, light, and current. LCEs are a class of material that can change shape in response to stimuli such as temperature, etc. This shape change is based on the ability of LC material to change from an ordered nematic (low temperature) phase to a disordered isotropic (high temperature) phase. Incorporating light absorbing particles in the material allows shape change to be triggered via light illumination where light absorbing particles convert light energy to heat and locally increase material temperature. The specific shape change response can be engineered for the material by aligning the LCE polymer chains in a desired orientation via different material processing methods, such as mechanical stretching of the polymer chains. For example, the polymer chains of LCE can be aligned via direct ink writing 3D printing where the polymer chains are aligned along the extruded filament via shear forces. In an aspect, the switch is based on LCEs where the polymer chains are aligned with an azimuthal (concentric) print path in a thin disc. As the device is heated via light illumination, the polymer chains contract along the direction of alignment allowing the LCE disc to morph into a cone. A liquid metal (LM) droplet is placed at the center of the LCE desk. When the disk morphs into a cone, the LM is brought in contact with the disconnected electrical path, which allows the frequency to change.

In an aspect, azobenzene-based LCE material can retain their shape without the need of constant stimulus. The shape is reversible upon command upon application of stimuli or after some time, the shape will go back to the original configuration. Azobenzene molecules in LCEs can allow LCEs to achieve shape memory properties by allowing them to temporarily retain a secondary shape. Azobenzene molecules can change their molecular shape from a trans (straight) to cis (bent) configuration. This change can be triggered by specific light and allows for a device to achieve significant shape change. When the light is applied, the Azo-based LCE will change shape and the polymer structure will become temporarily maintained in that configuration. Once the stimulus is removed, the device can retain that shape temporarily. The device can return to its original shape either with the passage of time or the application of stimuli such as light or heat.

Shape memory alloys can be programmed to take a secondary shape via: applying a load to change shape and reversing it via current, heat or light or applying a stimulus, such as current, heat or light, to change shape, and removing the stimulus to reverse shape. SMAs are metallic alloys that can recover their original shape after being deformed or achieve large and reversible deformations, known as super elasticity, by undergoing reversible phase transitions. One of the most used SMAs is nickel titanium alloy (NiTINOL). Superelasticity in SMAs can be achieved via the reversible transformation of the device under a load from one shape to a different shape, then returning to its original shape by heating the device up again. This actuation mechanism is based on the ability of NiTINOL to transform from a high temperature crystal structure (Austinite) to a different low temperature crystal structure (martensite). In superelasticity, specific shape change response in the SMA can be programmed by deforming the material in a specific configuration beyond its elastic limit. The device can take its secondary shape under a load, lock that shape, then return to its original shape when a stimulus, such as heat or current is introduced. An SMA-based switch will change shape to bring the two conductive paths in contact with each other via an applied load. The switch will stay in that configuration until stimulated with current or heat, allowing it to return to its original shape and breaking the contact between the conductive paths. This process can be repeated as needed. In another configuration, the SMA can be trained to change shape when applying a stimulus such as heat or light and go back to the original shape upon removal of the stimulus.

Shape memory polymers can be of different types of polymers such as cold hibernated elastic memory polymers (CHEM) or light-induced shape-memory effect polymers. Cold hibernated elastic memory polymers can change shape upon heating of the material above Tg. The shape can be retained without continuous stimulus. Heating can be applied again to revert to the original shape. CHEM are a type of shape memory polymers that can remember a specific shape and can return to that shape via stimuli such as heat. This shape changing ability in CHEM polymer stems from the specific structure of the polymer chains and the large change in the elastic modulus above and below a certain temperature known as the glass transition temperature (Tg) of the material. When temperature is reduced below Tg, the polymer chains in CHEM become ordered, forming a crystalline structure. Above Tg, the polymer chains become disordered making the material more elastic and exhibit a large amount of inelastic strain (up to 400%). As such, CHEM polymers can achieve significant shape change using their shape memory and elastic recovery properties. A CHEM based switch will have two different configurations above and below Tg. When Temperature is increased, the switch will change shape to connect the conductive paths, then retain that shape to keep the paths connected. Once temperature is applied a second time, the switch will change back to its original shape and disconnect the conductive paths.

Light-induced shape-memory effect in shape memory polymers (SMPs) can allow shape change by applying light at one wavelength. The shape is reversed by applying light at a different wavelength. By incorporating photothermal fillers, the shape and actuation of shape memory polymers (SMP) can be adjusted. The wavelength of the light, the polarization, and position can be adjusted to develop reversible SMPs, or multi shape configurations. There are many fillers and shape memory compositions that can be used and trained to achieve these deformations.

Dielectric Electroactive Polymers (DEA) can change shape upon application of an electric field. Dielectric electroactive polymers are materials that can change shape under an applied electric field as the electric charge distribution in the material changes. As such, a device can be designed using DEA polymers where the switch can have a shape that prevents the contact between the LM and the conductive paths. The DEA based device will also have another shape that allows contact between the conductive paths and LM when an electric field is applied.

Piezoelectric materials can change shape upon application of an electric field, which deforms the material. Piezoelectric materials are materials that can generate small deformation under an applied electrical field. The shape change mechanism of piezoelectric material-based device is very similar to DEA based device, however the amount of strain achieved, and the mechanical properties of the different material can be different.

In an aspect, the switch can be designed as a thin shape (e.g., a thin disk shape, polygonal shape, or the like) with about 2 to 20 mm or about 5 to 15 mm, or about 10 mm diameter and about 0.1 to 0.5 mm, about 0.2 to 0.4 mm, or about 0.3 mm thickness. In a particular aspect, the switch can be designed as a thin disk shape with a 10 mm diameter and 0.3 mm thickness. In an aspect, this disk can morph into a cone with heights of up to 5 mm bringing the LM droplet in contact with the conductive paths. However, the switch can be designed in any configuration that is most efficient for connecting the conductive paths. For example, if the coil needs to be placed on the side of a sample, the switch can be designed to connect and disconnect the paths via a sideways or horizontal motion, instead of the vertical motion of the flat disk.

As described herein, the stimuli-responsive switch (or multiple stimuli-responsive switches) can be included in a circuit. The circuit can be part of a nuclear magnetic resonance system. In an aspect, the circuit can be configured to change an operation frequency of a radiofrequency coil of the magnetic resonance system from a first frequency to a second frequency, where each frequency is a discrete frequency. The circuit includes a stimuli-responsive switch in a first state, where when the stimuli-responsive switch is in the first state, the operation frequency of the radiofrequency coil is at the first frequency (e.g., frequency for 1H). The circuit is configured to switch from the first state to a second state upon activation of the stimuli-responsive switch. When the stimuli-responsive switch is in the second state, the operation frequency of the radiofrequency coil is at the second frequency (e.g., frequency for 31P). Alternatively, in the second state, a different coil structure is activated. The circuit includes one or more the stimuli-responsive switches (such as those described herein), and a pair on conductors associated with each stimuli-responsive switch.

Now having described various features, the following aspects provide additional description.

Aspect 1. A device comprising: a stimuli-responsive switch and two conductors of a circuit, wherein the stimuli-responsive switch includes a stimuli-responsive material, wherein the stimuli-responsive switch includes a conductive material disposed on the stimuli-responsive material of the stimuli-responsive switch, wherein the stimuli-responsive switch has the characteristic of being responsive to a stimuli, wherein the stimuli-responsive switch is in a first state and is not in contact with the two conductors, wherein the stimuli-responsive switch is in a second state and is in electrical connection with the two conductors via the conductive material.

Aspect 2. The device of any of the preceding or following aspects, wherein the stimuli-responsive switch is made of a liquid crystal elastomer (LCE), an azobenzene-based LCE material, a shape memory ally, a shape memory polymer, a dielectric electroactive polymer, or a piezoelectric material.

Aspect 3. The device of any of the preceding or following aspects, wherein the conductive material is made of a liquid metal.

Aspect 4. The device of any of the preceding or following aspects, wherein the circuit is present in a magnetic resonance system.

Aspect 5. The device of any of the preceding or following aspects, wherein the circuit has the characteristic of being able to switch from the first state to the second state, wherein the switch from the first state to the second state results in an activation or a de-activation, of a conductive structure within a magnetic resonance system.

Aspect 6. The device of any of the preceding or following aspects, wherein the switch from the first state to the second state results in a change in a frequency of the magnetic resonance system.

Aspect 7. The device of any of the preceding or following aspects, wherein the frequency is an operation frequency of a radiofrequency coil.

Aspect 8. The device of any of the preceding or following aspects, wherein the field is near field.

Aspect 9. The device of any of the preceding or following aspects, wherein the change in frequency is between a starting frequency and another discrete frequency.

Aspect 10. The device of any of the preceding or following aspects, wherein the change in frequency is between a starting frequency and two or more discrete frequency.

Aspect 11. The device of any of the preceding or following aspects, wherein the stimuli-responsive material has the characteristic of being is responsive to stimuli selected from: light, heat, or current.

Aspect 12. The device of any of the preceding or following aspects, wherein the device comprises two or more stimuli-responsive switches, wherein each stimuli-responsive switch is positioned between two conductors of a circuit, wherein each of the stimuli-responsive switches includes a stimuli-responsive material, wherein each of the stimuli-responsive switches includes a conductive material disposed on the stimuli-responsive material of the stimuli-responsive switch, wherein each of the stimuli-responsive switches has the characteristic of being responsive to a stimuli, wherein each of the stimuli-responsive switches is in a first state and is not in contact with their respective two conductors, wherein each of the stimuli-responsive switches is in a second state and is in electrical connection with their respective two conductors via the conductive material.

Aspect 13. The device of any of the preceding or following aspects, wherein only one of the stimuli-responsive switches of the circuit establishes an electrical connection with their respective two conductors.

Aspect 14. The device of any of the preceding or following aspects, wherein only two of the stimuli-responsive switches of the circuit establishes an electrical connection with their respective two conductors.

Aspect 15. The device of any of the preceding or following aspects, wherein the stimuli-responsive switch is made of a liquid crystal elastomer (LCE), an azobenzene-based LCE material, a shape memory alloy, a shape memory polymer, or a dielectric electroactive polymer, and wherein the conductive material is made of a liquid metal, wherein the stimuli-responsive material has the characteristic of being responsive to stimuli selected from: light, heat, or current.

Aspect 16. A method of activating a switch in a circuit comprising: providing a stimuli-responsive switch in a first state, wherein the stimuli-responsive switch is between a first pair of conductors in the circuit, wherein when the stimuli-responsive switch is in a first state, the stimuli-responsive switch is not in contact with first pair of conductors, and stimulating the stimuli-responsive switch with a stimulus, wherein the stimuli-responsive switch changes from the first state to a second state, wherein when the stimuli-responsive switch is in a second state, the stimuli-responsive switch is in electrical connection with the first pair of conductors.

Aspect 17. The method of any of the preceding or following aspects, wherein the stimuli-responsive switch includes a stimuli-responsive material, wherein the stimuli-responsive switch includes a conductive material disposed on the stimuli-responsive material of the stimuli-responsive switch.

Aspect 18. The method of any of the preceding or following aspects, wherein the circuit is present in a magnetic resonance system, wherein the switch from the first state to the second state results in a change in an operation frequency of a radiofrequency coil of the magnetic resonance system from a first frequency to a second frequency.

Aspect 19. A nuclear magnetic resonance system, comprising: a circuit, wherein the circuit is configured to change an operation frequency of a radiofrequency coil of the magnetic resonance system from a first frequency to a second frequency, wherein the circuit includes a stimuli-responsive switch in a first state, wherein when the stimuli-responsive switch is in the first state, the operation frequency of the radiofrequency coil is at the first frequency, wherein the circuit is configured to switch from the first state to a second state upon stimulation of the stimuli-responsive switch by a stimulus, wherein when the stimuli-responsive switch is in the second state, the operation frequency of the radiofrequency coil is at the second frequency, wherein the circuit include the stimuli-responsive switch and two conductors, wherein the stimuli-responsive switch includes a stimuli-responsive material, wherein the stimuli-responsive switch includes a conductive material disposed on the stimuli-responsive switch, wherein when the stimuli-responsive switch is in a first state, the conductive material of the stimuli-responsive switch is not in contact with the two conductors, wherein when the stimuli-responsive switch is in the second state, the conductive material of the stimuli-responsive switch is in electrical connection with the two conductors via the conductive material.

Aspect 20. The system of any of the preceding or following aspects, wherein the stimuli-responsive switch is made of a liquid crystal elastomer (LCE), an azobenzene-based LCE material, a shape memory ally, a shape memory polymer, a dielectric electroactive polymer, or a piezoelectric material, wherein the conductive material is made of a liquid metal, wherein the stimuli-responsive material has the characteristic of being is responsive to stimuli selected from: light, heat, or current.

Aspect 21. A device comprising: a stimuli-responsive switch and two conductors of a circuit, wherein the stimuli-responsive switch includes a stimuli-responsive material, wherein the stimuli-responsive switch includes a conductive material disposed on the stimuli-responsive material of the stimuli-responsive switch, wherein the stimuli-responsive switch has the characteristic of being responsive to a stimuli, wherein the stimuli-responsive switch is in a first state and is in contact with the two conductors via the conductive material, wherein the stimuli-responsive switch is in a second state and is not in electrical connection with the two conductors.

Aspect 22. The device of any of the preceding or following aspects, wherein the stimuli-responsive switch is made of a liquid crystal elastomer (LCE), an azobenzene-based LCE material, a shape memory ally, a shape memory polymer, a dielectric electroactive polymer, or a piezoelectric material.

Aspect 23. The device of any of the preceding or following aspects, wherein the conductive material is made of a liquid metal.

Aspect 24. The device of any of the preceding or following aspects, wherein the circuit is present in a magnetic resonance system.

Aspect 25. The device of any of the preceding or following aspects, wherein the circuit has the characteristic of being able to switch from the first state to the second state, wherein the switch from the first state to the second state results in an activation or a de-activation, of a conductive structure within a magnetic resonance system.

Aspect 26. The device of any of the preceding or following aspects, wherein the switch from the second state to the first state results in a change in a frequency of the magnetic resonance system.

Aspect 27. The device of any of the preceding or following aspects, wherein the frequency is an operation frequency of a radiofrequency coil.

Aspect 28. The device of any of the preceding or following aspects, wherein the field is near field.

Aspect 29. The device of any of the preceding or following aspects, wherein the change in frequency is between a starting frequency and another discrete frequency.

Aspect 30. The device of any of the preceding or following aspects, wherein the change in frequency is between a starting frequency and two or more discrete frequency.

Aspect 31. The device of any of the preceding or following aspects, wherein the stimuli-responsive material has the characteristic of being responsive to stimuli selected from: light, heat, or current.

Aspect 32. The device of any of the preceding or following aspects, wherein the device comprises two or more stimuli-responsive switches, wherein each stimuli-responsive switch is positioned between two conductors of a circuit, wherein each of the stimuli-responsive switches includes a stimuli-responsive material, wherein each of the stimuli-responsive switches includes a conductive material disposed on the stimuli-responsive material of the stimuli-responsive switch, wherein each of the stimuli-responsive switches has the characteristic of being responsive to a stimuli, wherein each of the stimuli-responsive switches is in a second state and is not in contact with their respective two conductors, wherein each of the stimuli-responsive switches is in a first state and is in electrical connection with their respective two conductors via the conductive material.

Aspect 33. The device of any of the preceding or following aspects, wherein only one of the stimuli-responsive switches of the circuit establishes an electrical connection with their respective two conductors.

Aspect 34 The device of any of the preceding or following aspects, wherein only two of the stimuli-responsive switches of the circuit establishes an electrical connection with their respective two conductors.

Aspect 35. The device of any of the preceding or following aspects, wherein the stimuli-responsive switch is made of a liquid crystal elastomer (LCE), an azobenzene-based LCE material, a shape memory ally, a shape memory polymer, or a dielectric electroactive polymer, and wherein the conductive material is made of a liquid metal, wherein the stimuli-responsive material has the characteristic of being is responsive to stimuli selected from: light, heat, or current.

Aspect 36. A method of activating a switch in a circuit comprising: providing a stimuli-responsive switch in a first state, wherein the stimuli-responsive switch is between a first pair of conductors in the circuit, wherein when the stimuli-responsive switch is in a first state, the stimuli-responsive switch is in contact with first pair of conductors, and stimulating the stimuli-responsive switch with a stimulus, wherein the stimuli-responsive switch changes from the first state to a second state, wherein when the stimuli-responsive switch is in a second state, the stimuli-responsive switch is not in electrical connection with the first pair of conductors.

Aspect 37. The method of any of the preceding or following aspects, wherein the stimuli-responsive switch includes a stimuli-responsive material, wherein the stimuli-responsive switch includes a conductive material disposed on the stimuli-responsive material of the stimuli-responsive switch.

Aspect 38. The method of any of the preceding or following aspects, wherein the circuit is present in a magnetic resonance system, wherein the switch from the first state to the second state results in a change in an operation frequency of a radiofrequency coil of the magnetic resonance system from a first frequency to a second frequency.

Aspect 39. A nuclear magnetic resonance system, comprising: a circuit, wherein the circuit is configured to change an operation frequency of a radiofrequency coil of the magnetic resonance system from a first frequency to a second frequency, wherein the circuit includes a stimuli-responsive switch in a second state, wherein when the stimuli-responsive switch is in the second state, the operation frequency of the radiofrequency coil is at the first frequency, wherein the circuit is configured to switch from the second state to a first state upon stimulation of the stimuli-responsive switch by a stimulus, wherein when the stimuli-responsive switch is in the first state, the operation frequency of the radiofrequency coil is at the second frequency, wherein the circuit includes the stimuli-responsive switch and two conductors, wherein the stimuli-responsive switch includes a stimuli-responsive material, wherein the stimuli-responsive switch includes a conductive material disposed on the stimuli-responsive switch, wherein when the stimuli-responsive switch is in a second state, the conductive material of the stimuli-responsive switch is not in contact with the two conductors, wherein when the stimuli-responsive switch is in the first state, the conductive material of the stimuli-responsive switch is in electrical connection with the two conductors via the conductive material.

Aspect 30. The system of any of the preceding or following aspects, wherein the stimuli-responsive switch is made of a liquid crystal elastomer (LCE), an azobenzene-based LCE material, a shape memory ally, a shape memory polymer, a dielectric electroactive polymer, or a piezoelectric material, wherein the conductive material is made of a liquid metal, wherein the stimuli-responsive material has the characteristic of being is responsive to stimuli selected from: light, heat, or current.

Additional details will be provided in the following Examples.

Example 1

Current methods used in multinuclear NMR typically involve the incorporation of lossy components that impact coil performance. This results in decreased sensitivity for at least one of the nuclei when compared to their single-tuned counterpart[1-4]. In particular, switching configurations implemented in multinuclear designs have reported losses between 30-75% in Q and 30-45% in SNR[5,6] for the worst-case nucleus. The application of switching between frequencies has the unique characteristic of not being time sensitive. This opens the option to use novel stimuli-sensitive materials to actuate variable conductive paths with switching times of up to tens of seconds. We developed a novel switching method that incorporates liquid crystal elastomers (LCE). LCEs are materials that can be programmed to have reversible shape changes in response to stimuli such as light, heat, and current[7-9]. The LCE in our system is actuated by a remote infrared mechanism[10,11], which provides the potential to change the frequency of interest at any point with negligible impact to positioning and scan time.

Methods

Hardware and Materials

The proposed switching system is composed of an RF coil with capacitive tune and match circuitry, an LCE, a liquid metal alloy (LM), and a light source. To test the system, four 4-cm loop coils were built using 18 AWG enameled copper wire (8049, Belden). The tune and match networks were designed based on a switchable network previously developed by our group[12]. However, the PIN diodes and DC lines on the board were replaced by discontinued trace paths. Each trace path contained capacitors to tune the coils to additional frequencies (FIG. 1.1).

The LCE was developed using two-step thiol-ene click reaction[13] with embedded 0.4 wt % of light absorbing carbon black (CB) particles. The incorporation of CB particles enables shape change upon exposure to near infrared (NIR) light illumination. To program the desired shape change, a thin 10 mm disk was 3D printed with an azimuthal print path. A small droplet of LM was placed in the center of the LCE. Finally, the light source consisted of an NIR chip on board LED (Luminus Devices, Inc., CBM-120).

Actuation Testing

A testing platform was designed to align the components in the system and enable coil tuning. The light source was placed on the bottom level and the LCE on the middle level directly aligned with the LED. Finally, the coil was placed on the top level and the break on the trace path was aligned with the LM droplet (FIG. 2.1).

To evaluate the feasibility and performance of the proposed switching system, testing was performed in two coil configurations. The first configuration consisted of a single-tuned 1H loop coil for 3T (128 MHZ) with a trace break on the ground line to open the circuit. For initial testing and to facilitate the connection, two wires were connected to each side of the break. These wires protruded on the underside of the board. Once the setup was tested, a double-sided board (with only traces) was used for testing. An identical coil but without any trace breaks served as a reference. The second configuration consisted of the switchable tuning and matching circuit shown in FIG. 1.1. The second path on the circuit was designed to tune the coil to 31P (51.7 MHZ). A single-tuned 31P coil was used as a reference. To estimate the losses from a larger circuit board with more components, the same coil was evaluated with the 31P path soldered using copper tape rather than the LM connection. Coil configurations as well as the LCE-LM system are shown in FIG. 1.2. To assess coil performance, all bench measurements (S11 and Q) were acquired on the same platform with the LED power supply on.

Results

Each level of the testing platform with the corresponding system elements are shown in FIG. 2.1. Upon activation of the light source, the thin LCE-CB disk morphed into a cone shape, allowing the LM to close the connection on the corresponding coil circuit (FIGS. 1.3A and B). In the first coil configuration, the LCE coil was successfully tuned to 128 MHz. In the second coil configuration, the frequency of the LCE coil was successfully switched from 128 MHz to 51.7 MHz in approximately 20 seconds. The $S_{11}$ plots of the switching and reference coils are shown in FIG. 1.4A-C. The Q unloaded/loaded measurements are shown in Table 1.

TABLE 1

$S_{11}$ and Q measurements on reference and switching coils

| | Frequency | Coil | $Q_{UN}$ | % Diff. |
|---|---|---|---|---|
| Config. #1: Single-tuned | $^{1}$H (128 MHz) | Reference | 173 | — |
| | | Switching (wires) | 150 | −13% |
| | | Switching (traces) | 180 | 4.2% |
| Config. #2: Switchable | $^{1}$H (128 MHz) | Ref #1: Single-tuned | 173 | — |
| | | Switching | 147 | Ref #1: −15% |
| | $^{31}$P (51.7 MHz) | Ref #1: Single-tuned | 269 | — |
| | | Ref #2: Switching + Copper tape | 235 | Ref #1: −13% |
| | | Switching + LCE | 198 | Ref #1: −26% Ref#2: −15% |

Discussion

The operation of the switching design discussed in this work was successfully demonstrated for $^{1}$H and $^{31}$P at 3T. This design can be implemented for any field strength and combination of nuclei. Furthermore, the proposed switching system resulted in smaller differences in Q between switching and single-tuned coils when compared to other switching techniques reported in the literature. As previously mentioned, losses typically range between 30-75% in Q for the worst-case nucleus whereas our losses remained below 26% for both nuclei. These losses can be explained from the addition of components as well as the footprint of the board. Furthermore, we observed some variations depending on the size of the LM droplet, the contact pressure with the board, and the positioning. These features were not optimized for this demonstration. Immediate future work includes refinements in circuit design, an optimized setup, and imaging comparisons to further assess performance. Further developments of this technique will be tailoring the setup to be more realistically implemented on a patient in a scanner, including incorporating an MR-compatible light source with out-of-bore activation and modifying the multi-platform strategy to support coils at various orientations.

Conclusion

As demonstrated in this work, the LCE switching system has the potential to address the challenges of traditional multi-tuning methods. The lower loss in Q, the smaller footprint, and the potential to incorporate out-of-bore actuation make this system an attractive alternative to current techniques.

References for Example 1

1. Choi C H, Hong S M, Felder J, et al. The state-of-the-art and emerging design approaches of double-tuned RF coils for X-nuclei, brain MR imaging and spectroscopy: A review. Magn Reson Imaging 2020; 72:103-116.
2. Meyerspeer M, Roig E S, Gruetter R, et al. An Improved Trap Design for Decoupling Multinuclear RF coils Magnetic Resonance in Medicine 2014; 72:584-590.
3. Schnall M D, Harihara Subramanian V, Leigh J S, et al. A new double-tuned probed for concurrent 1H and 31P NMR. Journal of Magnetic Resonance (1969) 1985; 65 (1): 122-129.
4. Maunder A, Rao M, Robb F, et al. Comparison of MEMS switches and PIN diodes for switched dual tuned RF coils. Magnetic Resonance in Medicine 2018; 80 (4): 1746-1753.
5. Lim H, Thind K, Martinez-Santiesteban F M, et al. Construction and evaluation of a switch-tuned<sup>13</sup>C-<sup>1</sup>H birdcage radiofrequency coil for imaging the metabolism of hyperpolarized<sup>13</sup>C-enriched compounds. Journal of Magnetic Resonance Imaging 2014; 40 (5): 1082-1090.
6. Choi C H, Hong S M, Ha Y, et al. Design and construction of a novel (1) H/(19) F double-tuned coil system using PIN-diode switches at 9.4T. J Magn Reson 2017; 279:11-15.
7. Ambulo C P, Burroughs J J, Boothby J M, et al. Four-dimensional Printing of Liquid Crystal Elastomers. ACS Appl Mater Interfaces 2017; 9 (42): 37332-37339.
8. Ambulo C P, Ford M J, Searles K, et al. 4D-Printable Liquid Metal-Liquid Crystal Elastomer Composites. ACS Appl Mater Interfaces 2021; 13 (11): 12805-12813.
9. Kularatne R S, Kim H, Boothby J M, et al. Liquid crystal elastomer actuators: Synthesis, alignment, and applications. Journal of Polymer Science Part B: Polymer Physics 2017; 55 (5): 395-411.
10. Zhang W, Nan Y, Wu Z, et al. Photothermal-Driven Liquid Crystal Elastomers: Materials, Alignment and Applications. Molecules 2022; 27 (14): 4330.
11. Liu W, Guo L-X, Lin B-P, et al. Near-Infrared Responsive Liquid Crystalline Elastomers Containing Photothermal Conjugated Polymers. Macromolecules 2016; 49 (11): 4023-4030.
12. Carrell T, Del Bosque R, Wilcox M, et al. A three-element triple-tuned array implemented with switchable matching and tuning. 2019 May 2019; Montreal, C A.
13. Saed M O, Ambulo C P, Kim H, et al. Molecularly-Engineered, 4D-Printed Liquid Crystal Elastomer Actuators. Advanced Functional Materials 2019; 29 (3): 1806412.

Example 2

Magnetic Resonance Imaging and Spectroscopy (MRI/S) are powerful non-invasive diagnostic tools that enable access to a wealth of chemical and physical information. In clinical settings, these tools are primarily used to assess structural and functional information from hydrogen ($^{1}$H) in the body. The use of non-$^{1}$H nuclei, also known as X-nuclei, can provide biochemical information that has the potential to further improve the study and evaluation of disease [1].

However, implementing X-nuclei MRI/S requires developing specialized hardware, including multinuclear radiofrequency (RF) coils [1, 2]. The development of RF coils is challenging because they must be highly sensitive to enable the detection of low gamma, less abundant X-nuclei. Several multi-tuning methods have been investigated and reported in the literature. Some of these methods include utilizing LC/LCC traps or switches in single-structure coils [3, 4]. Unfortunately, these methods of multi-frequency tuning involve the incorporation of lossy components that hinder coil sensitivity [5]. With the incorporation of such components, switching configurations specifically, have reported high losses in bench measurements and in SNR. Lim et al. reported losses of 75% in Q and 45% in SNR for the worst-case nucleus in comparison with single-tuned coils [6]. Choi et al. reported losses of 25% in $Q_{ratio}$ and 30% in SNR for the worst-case nucleus when compared to a single-tuned coil [4].

The development of low-loss multi-tuning networks continues to be a goal in MRI/S. The application of switching between nuclei/frequencies fortunately has the advantage of not requiring high switching speeds-just the ability to co-register the data and not switch coils/move the subject. As a result, in this work, we explore the use of liquid crystal elastomers (LCEs) as a low-loss, novel switching method for multinuclear RF coils. LCEs are a class of novel materials that can undergo large, reversible, and programmed shape change over a period of seconds in response to MR compatible stimuli such as light [7-9]. The proposed switching method uses remote infrared light for actuation and liquid metal (LM) as the conductive element in the switch. Methods A. Hardware and Materials A total of seven RF coils were developed for testing. The coils were 4 cm loops built using 18 AWG enameled copper wire (8049, Belden). The circuit networks were milled on single and double-sided 1 oz copper clad FR4 boards using a circuit milling system (LPKF Protomat S63). Fixed (111C Series, Passive Plus) and variable (SGC3S Series, Sprague-Goodman) capacitors were used on the networks to achieve tuning and matching. The networks that incorporated the LCE switching system were designed with breaks in the trace paths for the LCE to fill when actuated. On the other hand, the network with standard switching technology incorporated a PIN diode (MA4P7470F, MACOM), RF chokes (1812LS, Coil Craft), and DC lines for biasing. The DC lines were powered through an in-house bias board consisting of a current-limiting resistor (CRCW0402 Series, Vishay) and an RF choke.

The LCE material was synthesized via a two-step thiol-ene “click” reaction [10, 11]. Synthesis and material processing was carried out following previously published methods [12]. To enable LCE actuation with near-infrared (NIR) light illumination, 0.4 wt % of light absorbing carbon black particles were embedded in the polymer [12, 13]. The composite LC oligomer mixture was placed in a stainless-steel reservoir and loaded into the TAM-15 extruder print-head attachment of a System 30M 3D printer (Hyrel E D, Norcross, GA). A 24G stainless steel dispensing needle with an inner diameter of 310 μm was attached to the reservoir nozzle. The material was printed as a disk with 0.6 mm thickness and 10 mm diameter. An Archimedean chord pattern was used to align LCE material while printing which resulted in LCE disks that, upon actuation, morphed into a cone [14]. Finally, a droplet of the liquid metal alloy eutectic gallium indium (EGaIn) was placed on the center of the LCE.

A custom testing platform was developed to combine the different elements of the switching technology in a consistent manner. The platform was made of three plexiglass stages aligned on top of each other (FIG. 2.1). The third level (bottom stage) contained an NIR chip on board LED (Luminus Devices, Inc., CBM-120) for LCE actuation. The second level consisted of a glass slide holder to place the LCE 1 cm away from the third level. At this distance, the light intensity of the LED was varied between 100-250 mW/cm2 depending on the desired level of actuation of the LCE. The top level was a holder for placement of the RF coil in alignment with the LCE and the LM.

B. LCE Switch Preliminary Evaluation

Preliminary evaluation of the switching system tested the ability of the LCE and LM to complete a connection. A double-loop pick-up probe was placed 2 cm from the surface of level 1 on the test platform. The pick-up probe was connected to a network analyzer (Agilent Technologies E5071C) in an S21 configuration. Two 4 cm comparison coils were resonated to the 1H frequency at 3T (128 MHZ) for testing: 1) Coil R-Ref was a standard resonant loop coil, and 2) Coil R-LCE was identical but had an open trace path between one end of the loop and the tuning capacitors to eventually be closed by the LCE.

The performance of Coil R-LCE and the switching system was evaluated by comparing bench measurements with a reference and positive control. In each test case, the coils were placed on the test platform and compared under the same testing conditions, i.e., the NIR light was ON and the LCE switch was present and actuated. Three test cases were performed with these coils:

Test Case #1: Coil R-Ref was used as the reference coil. The coil was placed on the testing platform, and the LCE was actuated using the NIR light. The LCE actuation was limited (light intensity: 100 mW/cm2), so the LM drop would not contact the coil network.

Test Case #2: Coil R-LCE was placed on the testing platform in the same manner. For this test, the LCE was fully actuated (light intensity: 250 mW/cm2), so the LM drop connected the discontinued trace path on the board.

Test Case #3: For the positive control (PC), the discontinued trace path on Coil R-LCE was connected using copper tape to represent the ideal outcome of testing (Coil R-PC). The coil was once again placed on the platform, and the LCE was actuated. The LCE actuation was limited (light intensity: 100 mW/cm2) to prevent LM contact with the coil network.

The coils used in each of the three test cases are shown in FIGS. 2.2A-C. S21 and Q measurements were recorded for each test case. The percent change for test cases #2 and #3 was calculated with respect to Coil R-Ref.

The LCE/LM was evaluated for its switching capability by implementing it to detune a 1H single-tuned coil. The tune and match network was designed on a double-sided board. The network design is shown in FIG. 2.3A-C. The bottom side consisted of two individual traces that were connected to each end of the coil loop via through-holes. The purpose of the traces was to short across the tuning capacitor to detune the coil when connected. The coil was connected to port 1 of the network analyzer (NA) in an S11 configuration and placed on the platform as described previously.

The LCE was actuated with the NIR light to enable connection between the LM and the copper traces.

C. Multifrequency Switching Design and Performance

Four coils were used for testing the potential of the LCE to enable multifrequency coils via switching. The first two coils were single-tuned coils (Coil-ST), one for $^1$H and the other for the additional X-nuclei frequency. In this case, phosphorous (31P), with a frequency of 51.7 MHz at 3 T, was chosen as the second nucleus. The third coil (Coil-DT-LCE) was designed to be connected with the LCE. Finally, the fourth coil (Coil-DT-D) was designed with an identical network as the LCE coil but achieved frequency switching using a standard PIN diode configuration. The switching connections on Coil-DT-D were adjusted to account for the addition of the PIN diode, the RF choke, and the DC lines.

The switching networks were designed in a similar configuration to work previously reported by our group [15]. The network design for both coils is shown in FIG. 2.3A-C.

The networks were implemented on double-sided boards. The placement of the bottom traces was designed to avoid the introduction of capacitance between the top and bottom layers. Additionally, the networks were designed to minimize the number of connections needed to switch frequency. In this way, the undesired creation of additional potentially resonant loops was minimized as much as possible.

All four coils were placed on the testing platform and evaluated using Q measurements. Furthermore, as done previously, a positive control coil was created by completing the connection of Coil-DT-LCE using copper tape (Coil-DT-PC). The percent change between the single-tuned and switching coils was calculated.

Results and Discussion

A. Hardware and Materials

The testing platform successfully contained and aligned the components in the system. In future developments of this technology, a compact and enclosed setup will be needed to encase the LCE switch. Furthermore, the NIR chip on board LED will be replaced with an MR-compatible light source that will enable out-of-bore activation.

The LCE was successfully actuated at different rates using different light intensities. For the current development, continuous light illumination is required to maintain LCE actuation. However, fixed shape deformation has been reported with the incorporation of azobenzene or hydrazone molecules in LCE networks [16, 17]. These shape deformations are reversible with time or with the application of a second stimulus, e.g., heat or light at a different wavelength.

B. LCE Switch Preliminary Evaluation

Table 1 lists the S21 and Q measurements of the resonant coil structures. The difference in Q between the LCE coil and the reference coil remained below 5%, which was considered negligible.

TABLE I

RESONANT COIL STRUCTURES BENCH MEASUREMENTS

| Coil | Bench Measurement $S_{21}$ | Q | Q % Change |
|---|---|---|---|
| Coil R-Ref | −24.2 | 312 | — |
| Coil R-LCE | −25.4 | 297 | −4.80% |
| Coil R-PC | −23.7 | 312 | 0.04% |

The LCE/LM as a switch successfully detuned the single-tuned coil. Although this switch is not viable to be implemented as a detuning method due to the slow switching speed (20 s), its performance demonstrated its ability to interact with a circuit as planned.

C. Multifrequency Switching Design and Performance

Matching of better than −29 dB was achieved for all tested coils. The S11 plots of each coil and frequency are shown in FIG. 2.4A-B.

The LCE/LM switch before and after actuation, making full contact with a board, is shown in FIG. 2.5A-B.

The switching time for this test was approximately 60 s. The switching time can be decreased by placing the coil board closer to the LCE and adjusting the NIR light intensity. In this case, the actuation of the LCE was performed at a slower rate, and the coil was placed further away from the LCE for better viewing of the actuation. However, as demonstrated in the previous test case, the connection can be performed in 20 s.

Table 2 shows the results of the bench measurements and calculated percent change between the reference, the positive control, and the switching coils. The decrease in Q between the single-tuned coils and the switching designs is expected due to the increased number of components, connections, and traces. As such, the positive control provided a better way to assess the performance of the LCE/LM on a similar coil.

TABLE II

BENCH MEASUREMENT RESULTS FOR $^1$H AND $^{31}$P COILS

| | Frequency: 128 MHz | | | Frequency: 51.7 MHz | | |
|---|---|---|---|---|---|---|
| Coil | Q | Q % Change (w.r.t.[b] Coil-ST) | Q % Change (w.r.t.[b] Coil-DT-LCE) | Q | Q % Change (w.r.t.[b] Coil-ST) | Q % Change (w.r.t.[b] Coil-DT-LCE) |
| Coil-ST (Single-Tuned) | 291 | N/A | N/A | 323 | N/A | N/A |
| Coil DT-PC (Positive Control) | N/A[a] | N/A | N/A | 235 | −27% | N/A |

TABLE II-continued

BENCH MEASUREMENT RESULTS FOR $^1H$ AND $^{31}P$ COILS

| | Frequency: 128 MHz | | | Frequency: 51.7 MHz | | |
|---|---|---|---|---|---|---|
| Coil | Q | Q % Change (w.r.t.[b] Coil-ST) | Q % Change (w.r.t.[b] Coil-DT-LCE) | Q | Q % Change (w.r.t.[b] Coil-ST) | Q % Change (w.r.t.[b] Coil-DT-LCE) |
| Coil-DT-LCE (LCE Switch) | 228 | −21% | N/A | 199 | −38% | −15% |
| Coil-DT-D (Diode Switch) | 156 | −46% | −32% | 38 | −88% | −84% |

[a]No positive control was needed for $^1H$.
[b]With respect to

During testing, it was noted that after placing all the components on a new tune and match board and cleaning it with isopropanol, the LM made better contact with the copper traces, resulting in higher Q. After repeated handling of the board and adjustment of connections with solder and liquid metal, the Q decreased to 199 for 31P. Despite this issue, testing of the final board version resulted in the same Q measurement (199), as reported in Table 2, after testing with multiple connecting/disconnecting cycles. Although this Q value was 15% lower than the positive control, the coil performed substantially better than the coil with standard switching components (i.e., the PIN diode). The Q of the LCE switch coil was 32% higher for 1H and 84% higher for 31P than the diode switch coil. Even though the losses in Q in the PIN diode coil are consistent with similarly high Q losses (75%) observed in the literature [6], they are considered significant. This indicates that adjustments may be needed to improve coil performance. Adjustments to the switching circuitry design will be explored and evaluated.

Furthermore, the LCE switch to board distance and the light intensity will be improved for the implementation of the final version of the device. The actuation speed of the LCE is dependent on the intensity of the IR light triggering its shape change. In our experiment, we controlled the light intensity of the board LED by varying the supplied current. The light intensity at the surface of the LCE depends on the distance between the sample and the NIR LED. For these experiments, the distance between the light and the LCE switch were kept the same and light intensities were varied between 100-250 mW/cm2 to adjust the actuation rate as needed for each experiment. NIR irradiation at low intensities are non-ionizing, non-thermal, and safe for human exposure [18, 19]. NIR light with low intensities is commonly used in photobiomodulation for simulation, healing, and regeneration of tissue [20]. Ferraresi et al., studied the therapeutic effects of NIR light with intensities ranging from 100-500 mW/cm2, and concluded that such light therapy could have therapeutic effects for athletes [21]. Although the system design in this study will be enclosed and we do not expect a subject to be exposed to the light, any potential exposure of light with intensities of 100-250 mW/cm2 is considered non-hazardous. These results showcase the potential of the proposed switching technology for coil multi-tuning for any field strength and combination of nuclei. Future work will focus on utilizing an MR-compatible light source (e.g., fiber optic cables connected to a remote light source) and enable placement of the switching system at various orientations. Imaging data will also be acquired to perform SNR comparisons and further assess the proposed switching technology. Furthermore, the final version of the switching design will be encased and isolated to prevent any changes or introducing impurities that may impact contact with LM.

Conclusion

A new frequency switching method for multinuclear MRI/S was presented. The LCE switch was compared to standard switching technology, and performance consistent with low loss switching networks was demonstrated. Future work will focus on repeatability testing, adding more frequencies to the network, as well as incorporating MR-compatible elements for testing in a scanner.

References for Example 2

[1] G. Madelin, X-Nuclei Magnetic Resonance Imaging. Jenny Stanford Publishing Pte. Ltd., 2022, p. 466.

[2] R. Hu, D. Kleimaier, M. Malzacher, M. A. U. Hoesl, N. K. Paschke, and L. R. Schad, “X-nuclei imaging: Current state, technical challenges, and future directions,” Journal of Magnetic Resonance Imaging, vol. 51, no. 2, pp. 355-376, 2020 Feb. 1 2020, doi: 10.1002/jmri.26780.

[3] M. D. Schnall, V. Harihara Subramanian, J. S. Leigh, and B. Chance, “A new double-tuned probed for concurrent 1H and 31P NMR,” (in en), Journal of Magnetic Resonance (1969), vol. 65, no. 1, pp. 122-129, 1985 Oct. 15 1985, doi: 10.1016/0022-2364 (85) 90380-4.

[4] C. H. Choi, S. M. Hong, Y. Ha, and N. J. Shah, “Design and construction of a novel (1) H/(19) F double-tuned coil system using PIN-diode switches at 9.4T,” J Magn Reson, vol. 279, pp. 11-15, June 2017, doi: 10.1016/j.jmr.2017.04.005.

[5] C. H. Choi, S. M. Hong, J. Felder, and N. J. Shah, “The state-of-the-art and emerging design approaches of double-tuned RF coils for X-nuclei, brain MR imaging and spectroscopy: A review,” Magn Reson Imaging, vol. 72, pp. 103-116, October 2020, doi: 10.1016/j.mri.2020.07.003.

[6] H. Lim, K. Thind, F. M. Martinez-Santiesteban, and T. J. Scholl, “Construction and evaluation of a switch-tuned 13C-1H birdcage radiofrequency coil for imaging the metabolism of hyperpolarized 13C-enriched compounds,” Journal of Magnetic Resonance Imaging, vol. 40, no. 5, pp. 1082-1090, 2014 Nov. 1 2014, doi: 10.1002/jmri.24458.

[7] C. P. Ambulo, S. Tasmim, S. Wang, M. K. Abdelrahman, P. E. Zimmern, and T. H. Ware, “Processing advances in liquid crystal elastomers provide a path to biomedical applications,” Journal of Applied Physics, vol. 128, no. 14, p. 140901, 2020 Oct. 14 2020, doi: 10.1063/5.0021143.

[8] L. Yang, K. Setyowati, A. Li, S. Gong, and J. Chen, “Reversible Infrared Actuation of Carbon Nanotube-Liquid Crystalline Elastomer Nanocomposites," Adv. Mater., vol. 20, no. 12, pp. 2271-2275, 2008, doi: https://doi.org/10.1002/adma.200702953.

[9] D. M. Meng Wang, Chengjie Wang, "Near-Infrared Light Responsive Liquid Crystal Elastomers," Progress in Chemistry, vol. 32, no. 10, pp. 1452-1461, 2020 Oct. 24 2020, doi: 10.7536/pc200335.

[10] M. O. Saed et al., "Molecularly-Engineered, 4D-Printed Liquid Crystal Elastomer Actuators," Advanced Functional Materials, vol. 29, no. 3, p. 1806412, 2019 Jan. 1 2019, doi: 10.1002/adfm.201806412.

[11] R. S. Kularatne, H. Kim, J. M. Boothby, and T. H. Ware, "Liquid crystal elastomer actuators: Synthesis, alignment, and applications," Journal of Polymer Science Part B: Polymer Physics, vol. 55, no. 5, pp. 395-411, 2017 Mar. 1 2017, doi: 10.1002/polb.24287.

[12] S. Tasmim et al., "Liquid crystal elastomer based dynamic device for urethral support: Potential treatment for stress urinary incontinence," Biomaterials, vol. 292, p. 121912, 2023 Jan. 1 2023, doi: https://doi.org/10.1016/j.biomaterials.2022.121912.

[13] C. Wang et al., "Soft Ultrathin Electronics Innervated Adaptive Fully Soft Robots," Adv. Mater., vol. 30, no. 13, p. 1706695, 2018 Mar. 1 2018, doi: 10.1002/adma.201706695.

[14] A. Kotikian, R. L. Truby, J. W. Boley, T. J. White, and J. A. Lewis, "3D Printing of Liquid Crystal Elastomeric Actuators with Spatially Programed Nematic Order," Adv. Mater., vol. 30, no. 10, p. 1706164, 2018 Mar. 1 2018, doi: 10.1002/adma.201706164.

[15] T. Carrell, R. Del Bosque, M. Wilcox, and M. McDougall, "A three-element triple-tuned array implemented with switchable matching and tuning," in Proceedings of the 27th Annual International Society of Magnetic Resonance in Medicine Conference, Montreal, CA, May 2019 2019.

[16] X. Lu et al., "4D-Printing of Photoswitchable Actuators," Angew Chem Int Ed Engl, vol. 60, no. 10, pp. 5536-5543 Mar. 1 2021, doi: 10.1002/anie.202012618.

[17] A. Ryabchun, Q. Li, F. Lancia, I. Aprahamian, and N. Katsonis, "Shape-Persistent Actuators from Hydrazone Photoswitches," Journal of the American Chemical Society, vol. 141, no. 3, pp. 1196-1200, 2019 Jan. 23 2019, doi: 10.1021/jacs.8b11558.

[18] J. C. Rojas and F. Gonzalez-Lima, "Low-level light therapy of the eye and brain," (in eng), Eye Brain, vol. 3, pp. 49-67, 2011, doi: 10.2147/eb.S21391.

[19] D. Barolet, F. Christiaens, and M. R. Hamblin, "Infrared and skin: Friend or foe," Journal of Photochemistry and Photobiology B: Biology, vol. 155, pp. 78-85, 2016 Feb. 1 2016, doi: https://doi.org/10.1016/j.jphotobiol.2015.12.014.

[20] R. J. Lanzafame, S. de la Torre, and G. H. Leibaschoff, "The Rationale for Photobiomodulation Therapy of Vaginal Tissue for Treatment of Genitourinary Syndrome of Menopause: An Analysis of Its Mechanism of Action, and Current Clinical Outcomes," (in eng), Photobiomodul Photomed Laser Surg, vol. 37, no. 7, pp. 395-407, July 2019, doi: 10.1089/photob.2019.4618.

[21] C. Ferraresi, Y.-Y. Huang, and M. R. Hamblin, "Photobiomodulation in human muscle tissue: an advantage in sports performance?," Journal of Biophotonics, vol. 9, no. 11-12, pp. 1273-1299, 2016 Dec. 1 2016, doi: 10.1002/jbio.201600176.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1 percent to about 5 percent" should be interpreted to include not only the explicitly recited concentration of about 0.1 weight percent to about 5 weight percent but also include individual concentrations (e.g., 1 percent, 2 percent, 3 percent, and 4 percent) and the sub-ranges (e.g., 0.5 percent, 1.1 percent, 2.2 percent, 3.3 percent, and 4.4 percent) within the indicated range. The term "about" can include traditional rounding according to significant figures of the numerical value. In addition, the phrase "about 'x' to 'y'" includes "about 'x' to about 'y'".

Many variations and modifications may be made to the above-described aspects. All such modifications and variations are intended to be included herein within the scope of this disclosure and protected by the following claims.

The invention claimed is:

1. A device comprising:

a stimuli-responsive switch and a first conductor of a circuit and a second conductor of the circuit, wherein the first conductor includes a first end of the first conductor and the second conductor includes a first end of the second conductor, wherein the stimuli-responsive switch includes a stimuli-responsive material, wherein the stimuli-responsive switch includes a conductive material disposed on the stimuli-responsive material of the stimuli-responsive switch, wherein the stimuli-responsive switch has the characteristic of being responsive to a stimuli, wherein the stimuli-responsive switch is in a first state and the conductive material is not in contact with the first end of the first conductor and the first end of the second conductor and wherein there is an area between the first end of the first conductor and the first end of the second conductor so the first end of the first conductor and the first end of the second conductor are not in contact with one another and wherein there is an area between the conductive material and each of the first end of the first conductor and the first end of the second conductor so that the conductive material is not in contact with the first end of the first conductor and the first end of the second conductor, wherein the stimuli-responsive switch is in a second state and is in electrical connection with the first end of the first conductor and the first end of the second conductor two conductors via the conductive material.

2. The device of claim 1, wherein the stimuli-responsive switch is made of a liquid crystal elastomer (LCE), an azobenzene-based LCE material, a shape memory alloy, a shape memory polymer, a dielectric electroactive polymer, or a piezoelectric material.

3. The device of claim 1, wherein the conductive material is made of a liquid metal.

4. The device of claim 1, wherein the circuit is present in a magnetic resonance system.

5. The device of claim 4, wherein the circuit has the characteristic of being able to switch from the first state to the second state, wherein the switch from the first state to the second state results in an activation or a de-activation, of a conductive structure within a magnetic resonance system.

6. The device of claim 5, wherein the switch from the first state to the second state results in a change in frequency of the magnetic resonance system.

7. The device of claim 6, wherein the frequency is an operation frequency of a radiofrequency coil.

8. The device of claim 7, wherein the field is near field.

9. The device of claim 6, wherein the change in frequency is between a starting frequency and another discrete frequency.

10. The device of claim 6, wherein the change in frequency is between a starting frequency and two or more discrete frequencies.

11. The device of claim 1, wherein the stimuli-responsive material has the characteristic of being responsive to stimuli selected from: light, heat, or current.

12. The device of claim 1, wherein the device comprises two or more stimuli-responsive switches, wherein each stimuli-responsive switch is positioned between a first conductor of a circuit and a second conductor of the circuit, wherein there is a first conductor of a circuit and a second conductor of the circuit for each individual stimuli-responsive switch, wherein the first conductor includes a first end of the first conductor and the second conductor includes a first end of the second conductor, wherein each of the stimuli-responsive switches includes a stimuli-responsive material, wherein each of the stimuli-responsive switches includes a conductive material disposed on the stimuli-responsive material of the stimuli-responsive switch, wherein each of the stimuli-responsive switches has the characteristic of being responsive to a stimuli, wherein each of the stimuli-responsive switches is in a first state and is not in contact with first end of the first conductor and the first end of the second conductor and wherein there is an area between the first end of the first conductor and the first end of the second conductor so the first end of the first conductor and the first end of the second conductor are not in contact with one another and wherein there is an area between the conductive material and each of the first end of the first conductor and the first end of the second conductor so that the conductive material is not in contact with the first end of the first conductor and the first end of the second conductor, wherein each of the stimuli-responsive switches is in a second state and is in electrical connection with the first end of the first conductor and the first end of the second conductor via the conductive material.

13. The device of claim 12, wherein only one of the stimuli-responsive switches of the circuit establishes an electrical connection with their respective two conductors.

14. The device of claim 12, wherein only two of the stimuli-responsive switches of the circuit establishes an electrical connection with their respective first conductor of the circuit and second conductor of the circuit.

15. The device of claim 1, wherein the stimuli-responsive switch is made of a liquid crystal elastomer (LCE), an azobenzene-based LCE material, a shape memory ally, a shape memory polymer, or a dielectric electroactive polymer, and wherein the conductive material is made of a liquid metal, wherein the stimuli-responsive material has the characteristic of being is responsive to light.

16. A method of activating a switch in a circuit comprising:

providing a stimuli-responsive switch in a first state, wherein the stimuli-responsive switch is between a first pair of conductors in the circuit, wherein the first pair of conductors comprises a first conductor of the circuit and a second conductor of the circuit, wherein the first conductor includes a first end of the first conductor and the second conductor includes a first end of the second conductor, wherein when the stimuli-responsive switch is in a first state, the stimuli-responsive switch is not in contact with the first end of the first conductor and the first end of the second conductor and wherein there is an area between the first end of the first conductor and the first end of the second conductor so the first end of the first conductor and the first end of the second conductor are not in contact, and stimulating the stimuli-responsive switch with a stimulus, wherein the stimuli-responsive switch changes from the first state to a second state, wherein when the stimuli-responsive switch is in a second state, the stimuli-responsive switch is in electrical connection with the first pair of conductors.

17. The method of claim 16, wherein the stimuli-responsive switch includes a stimuli-responsive material, wherein the stimuli-responsive switch includes a conductive material disposed on the stimuli-responsive material of the stimuli-responsive switch, wherein the stimuli-responsive switch is made of a liquid crystal elastomer (LCE) and wherein the conductive material is made of a liquid metal.

18. The method of claim 16, wherein the circuit is present in a magnetic resonance system, wherein the switch from the first state to the second state results in a change in an operation frequency of a radiofrequency coil of the magnetic resonance system from a first frequency to a second frequency.

19. A nuclear magnetic resonance system, comprising:

a circuit, wherein the circuit is configured to change an operation frequency of a radiofrequency coil of the magnetic resonance system from a first frequency to a second frequency, wherein the first frequency and the second frequency are different frequencies, wherein the circuit includes a stimuli-responsive switch in a first state, wherein when the stimuli-responsive switch is in the first state, the operation frequency of the radiofrequency coil is at the first frequency, wherein the circuit is configured to switch from the first state to a second state upon stimulation of the stimuli-responsive switch by a stimulus, wherein when the stimuli-responsive switch is in the second state, the operation frequency of the radiofrequency coil is at the second frequency, wherein the circuit includes the stimuli-responsive switch and a first conductor of a circuit and a second conductor of the circuit, wherein the first conductor includes a first end of the first conductor and the second conductor includes a first end of the second conductor, wherein the stimuli-responsive switch includes a stimuli-responsive material, wherein the stimuli-responsive switch includes a conductive material disposed on the stimuli-responsive switch, wherein when the stimuli-responsive switch is in a first state, the conductive material of the stimuli-responsive switch is not in contact with the first end of the first conductor and the first end of the second conductor and wherein there is an area between the first end of the first conductor and the first end of the second conductor so the first end of the first conductor or the first end of the second conductor are not in contact and wherein there is an area between the conductive material and each of the first end of the first conductor or the first end of the second conductor so that the conductive material is not in contact with the first end of the first conductor and the first end of the second conductor, wherein when the stimuli-responsive switch is in the second state, the conductive material of the stimuli-responsive switch is in electrical connection with the first end of the first conductor and the first end of the second conductor via the conductive material.

20. The system of claim 19, wherein the stimuli-responsive switch is made of a liquid crystal elastomer (LCE), an azobenzene-based LCE material, a shape memory ally, a shape memory polymer, wherein the conductive material is made of a liquid metal, wherein the stimuli-responsive material has the characteristic of being is responsive to stimuli selected from: light, heat, or current.

* * * * *